(12) United States Patent
Davis

(10) Patent No.: US 6,417,117 B1
(45) Date of Patent: *Jul. 9, 2002

(54) SPIN COATING SPINDLE AND CHUCK ASSEMBLY

(75) Inventor: Shawn D. Davis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 40 days.

(21) Appl. No.: 09/714,766

(22) Filed: Nov. 16, 2000

Related U.S. Application Data

(62) Division of application No. 09/411,498, filed on Oct. 4, 1999, now Pat. No. 6,162,295, which is a division of application No. 08/667,785, filed on Jun. 21, 1996, now Pat. No. 5,985,031.

(51) Int. Cl.$^7$ .............................................. H01L 21/31
(52) U.S. Cl. ........................................................ 438/782
(58) Field of Search ............................. 118/52, 53, 54; 438/758, 780, 781, 782

(56) References Cited

U.S. PATENT DOCUMENTS

| | | |
|---|---|---|
| 4,113,492 A | 9/1978 | Sato et al. |
| 4,393,807 A | 7/1983 | Fujimura et al. |
| 4,510,176 A | 4/1985 | Cuthbert et al. |
| 4,691,722 A | 9/1987 | Silvernail et al. |
| 4,788,994 A | 12/1988 | Shinbara |
| 4,790,262 A | 12/1988 | Nakayama et al. |
| 4,838,979 A | 6/1989 | Nishida et al. |
| 4,856,456 A | 8/1989 | Hillman et al. |
| 4,886,012 A | 12/1989 | Ikeno et al. |
| 4,894,260 A | 1/1990 | Kumasaka et al. |
| 4,899,686 A | 2/1990 | Toshima et al. |
| 5,116,250 A | 5/1992 | Sago et al. |
| 5,143,552 A | 9/1992 | Moriyama |
| 5,156,681 A | 10/1992 | Harlan |
| 5,180,431 A | 1/1993 | Sugimoto et al. |
| 5,238,713 A | 8/1993 | Sago et al. |
| 5,264,246 A | 11/1993 | Ikeno |
| 5,289,222 A | 2/1994 | Hurtig |
| 5,358,740 A | 10/1994 | Bornside |
| 5,514,214 A | 5/1996 | Joel et al. |
| 5,518,542 A | 5/1996 | Matsukawa et al. |
| 5,565,034 A | 10/1996 | Nanbu et al. |
| 5,571,560 A | 11/1996 | Lin |
| 5,591,262 A | 1/1997 | Sago et al. |
| 5,608,943 A | 3/1997 | Konishi et al. |
| 5,611,886 A | 3/1997 | Bachman et al. |
| 5,626,675 A | 5/1997 | Sakamoto et al. |
| 5,658,615 A | 8/1997 | Hasbe et al. |
| 5,672,205 A | 9/1997 | Fujimoto et al. |
| 5,677,000 A | 10/1997 | Yoshioka et al. |
| 5,688,322 A | 11/1997 | Motoda et al. |
| 5,705,223 A | 1/1998 | Bunkofske |
| 5,711,809 A | 1/1998 | Kimura et al. |

(List continued on next page.)

FOREIGN PATENT DOCUMENTS

| | | |
|---|---|---|
| JP | 2-101732 | 4/1990 |
| JP | 2-216633 | 8/1990 |
| JP | 404053224 | 2/1992 |
| JP | 404074564 | 3/1992 |
| JP | 405082435 | 4/1993 |
| JP | 405109612 | 4/1993 |

*Primary Examiner*—Michael J. Sherry
*Assistant Examiner*—Lisa Kilday
(74) *Attorney, Agent, or Firm*—Kirkpatrick & Lockhart LLP

(57) ABSTRACT

An apparatus and methods for use in spin coating a coating material onto a wafer. The apparatus includes a rotatable chuck capable of supporting the wafer and a bowl having a bottom and a side defining an interior region, the bottom containing an opening through which said rotatable chuck is movable and separable from the bowl. In a preferred embodiment the bottom has a raised cylindrical portion containing the opening and, the rotatable chuck is positioned within the opening so that the wafer is in close proximity to the raised portion of the bowl so as to prevent solvent vapors from escaping the bowl through the opening.

8 Claims, 8 Drawing Sheets

U.S. PATENT DOCUMENTS

| | | | |
|---|---|---|---|
| 5,716,673 A | * 2/1998 | Yen et al. .................... 118/52 |
| 5,725,663 A | 3/1998 | Parrette |
| 5,769,945 A | 6/1998 | Davis et al. |
| 5,830,272 A | 11/1998 | Begin et al. |
| 5,861,061 A | 1/1999 | Hayes et al. |
| 5,893,004 A | 4/1999 | Yamamura |
| 5,985,031 A | 11/1999 | Davis |
| 6,132,802 A | 10/2000 | Davis et al. |
| 6,140,253 A | 10/2000 | Hayes et al. |
| 6,162,294 A | 12/2000 | Davis et al. |
| 6,162,295 A | 12/2000 | Davis |
| 6,168,660 B1 | 1/2001 | Hayes et al. |
| 6,221,157 B1 | 4/2001 | Davis et al. |

* cited by examiner

SPIN COATING SPINDLE AND CHUCK ASSEMBLY

This application is a divisional of U.S. application Ser. No. 09/411,498, filed on Oct. 4, 1999, now U.S. Pat. No. 6,162,295, which is a divisional of 08/667,785, filed on Jun. 21, 1996, now U.S. Pat. No. 5,985,031.

BACKGROUND OF THE INVENTION

1. Field of the Invention

The present invention generally related to lifting and process liquid dispense assemblies and methods. More particularly, the present invention relates to a separable spindle and coating bowl assembly and methods for use in a spin coating apparatus for dispensing a process liquid onto the surface of wafer shaped semiconductor material.

2. Description of the Invention Background

Integrated circuits are typically constructed by depositing a series of individual layers of predetermined materials on a wafer shaped semiconductor substrate, or "wafer." The individual layers of the integrated circuit are in tun produced by a series of manufacturing steps. For example, in forming an individual circuit layer on a wafer containing a previously formed circuit layer, an oxide, such as silicon dioxide, is deposited over the piously formed circuit layer to provide an insulating layer for the circuit. A pattern for the next circuit layer is the formed on the wafer using a radiation alterable material, known as photoresist. Photoresist materials are generally composed of a mixture of organic resins, sensitizers and solvents. Sensitizers are compounds, such as diazonapthaquinones, that undergo a chemical change upon exposure to radiant energy, such as visible and ultraviolet light resulting in an irradiated material having differing solvation characteristics with respect to various solvents than the nonirradiated material. Resins are used to provide mechanical strength to the photoresist and the solvents serve to lower the viscosity of the photoresist so that it can be uniformly applied to the surface of the wafers. After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a chemical, known as developer, in which either the irradiated or the nonirradiated photoresist is soluble and the photoresist is removed in the pattern defined by the mask, selectively exposing portions of the underlying insulating layer. The exposed portions of the insulating layer are then selectively removed using an etchant to expose corresponding sections of the underlying circuit layer. The photoresist must be resistant to the etchant, so as to limit the attach of the etchant to only the exposed portions of the insulating layer. Alternatively, the exposed underlying layer (s) may be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Photoresist and developer materials are typically applied to the wafer using a spin coating technique in which the photoresist is dispensed on the surface of the wafer as the wafer is spun on a rotating chuck. The spinning of the wafer distributes the photoresist over the surface of the material and exerts a shearing force that separates the excess photoresist from the wafer thereby providing a thin layer of photoresist on the surface of the wafer. Spin coating operations are performed in a clean room environment, and it is necessary to contain not only the excess coating material that is separated from the wafer, but also the vapor resulting from the evaporation of the solvent. In addition, photoresist materials are generally very expensive, ranging from $500 to $2300/gallon, therefore, reducing the amount of coating material used in the process can significantly reduce the overall cost of producing semiconductor devices. Also, a build-up of excess coating material in the bowl requires additional downtime to remove and clean the bowl that further increases production costs.

FIG. 1 shows a side view of a typical bowl 200 and a porous wafer support chuck 202 of the prior art, such as is disclosed in U.S. Pat. No. 5,289,222 issued Feb. 22, 1994 to Hurtig. The wafer support chuck 202 is supported by a shaft 204 that passes through a hole 206 in the bowl 200 and attaches to a spin motor 208 in a motor compartment 209. A wafer 210 having a top and a bottom surface, 212 and 214 respectively, is placed on the wafer support chuck 202 and is secured using a vacuum (not shown). The wafer 210 is spun and coating material such as potoresist or developer, is dispensed onto the top surface 212 of the wafer 210. The rotation of the wafer 210 causes the coating material to distribute over the top surface 212 and exerts a shear force on the coating material that separates excess coating material from the surface 212.

Some of the solvent in the excess coating material vaporizes upon leaving the surface producing dry aerosol particles of the coating mixed with the liquid drops which accumulate over time on wall 216 of the bowl 200. Also, he excess coating material has a tendency to creep around the edge of the wafer 210 and contaminate the bottom surface 214. If the coating material on the bottom surface 214 mitigates to the chuck 202 a loss of vacuum could occur and the wafer 210 will be released possibly damaging the wafer. A solvent spray nozzle 218 is attached to the bowl 200 and is directed toward the edge of the wafer 210 to rinse the bottom surface 214, thereby preventing a buildup of coating material. Solvent spray holes (not shown) are also provided in the bottom 217 of the bowl 200 to rinse the coating solution from the bottom surface.

The excess liquid coating and liquid solvent are drained from the bowl 200 using drain line 220 and the solvent vapors are purged from the bowl 200 with air through air purge line 222. Solvent vapors are exhausted from the motor compartment 209 through a safety exhaust line 224. The drain line 220, the air purge line 222 and the safety exhaust line 224 are connected to an exhaust manifold and the vapor and liquid are separated and either reclaimed or disposed accordingly.

One problem hat exists with the prior art design shown in FIG. 1 is that in the region between the bottom surface 214 of the wafer 210 and the bottom of the bowl 217 a low pressure zone is created that results in a recirculation zone being formed that the amount of contamination that reaches the bottom surface 214 of the wafer 210, the bottom of the bowl 217, the chuck 202, and the motor 208. The recirculation zone results in a lower production yield due to contamination of the wafers and an increase in the overall processing time due to the increased downtime required to clean the bowl 200.

One prior art effort to eliminate the recirculation zone, shown in FIG. 2, employs a bowl 200 having a bottom 217 that is in close proximity to the bottom surface 214. While this design does eliminate the recirculation zone beneath the bottom surface 214, the pressure differential between the edge of the wafer and the axis of rotation and the proximity of the bottom 217 to the bottom surface 214 produces a wicking effect that draws coating material in toward the center of the bowl 200. The proximity of the bottom surface 214 to the bottom 217 of the bowl 200 also makes it more difficult to rinse the coating material off the bottom surface 214 using the solvent spray nozzle 218.

Another problem is that prior art bowls are generally segregated, such as by divider 226, to prevent the excess coating material from getting splashed or drawn onto the bottom surface 214 of the wafer 210. While this design is effective for that purpose, the solvent is also segregated from the excess coating material that is removed from the wafer 210 and the dry aerosol particulates that are produced as the solvent in the coating evaporates, all of which makes it more difficult to remove the liquid and solid coating material from the bowl 200. The problems of the liquid coating drying and forming a build occur not only in the bowl, but in the drain lines leading to the exhaust manifold, which, of course, leads to increased downtime to clean the bowl and the drain lines. The amount of downtime required to clean the bowl in the prior art is further increased by the fact that in order to fully clean the bowl or the chuck and motor or to perform maintenance, the bowl and chuck have to be disassembled to seperate the components. Thus, it is apparent that a need exists for an improved spin coating bowl design and methods of use which overcome, among others, the above-discussed problems so as to provide a spin coating bowl that requires less maintenance and the maintenance that is performed requires less overall downtime.

SUMMARY OF THE INVENTION

The above objects and others are accomplished by an apparatus and method in accordance with the present invention. The apparatus is used in the process of spin coating a coating material onto a wafer and includes a rotatable chuck capable of supporting the wafer and a bowl having a bottom and a side defining an interior region, the bottom containing an opening through which said rotatable chuck is movable. In a preferred embodiment the bottom has a raised cylindrical portion containing the opening and, the rotatable chuck is positioned within the opening so that the wafer is in close proximity to the raised portion of the bowl so as to prevent solvent vapors from escaping the bowl through the opening.

Accordingly, the present invention provides a design and a method that increases the flexibility of the spin coating apparatus maintenance by allowing the wafer chuck and motor assembly to be separated from the process bowl without disassembly of either component and to provide added versatility in the positioning of the wafer within the process bowl. These and other details, objects, and advantages of the invention will become apparent as the following detailed description of the present preferred embodiment thereof proceeds.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENTS

Figure 1:
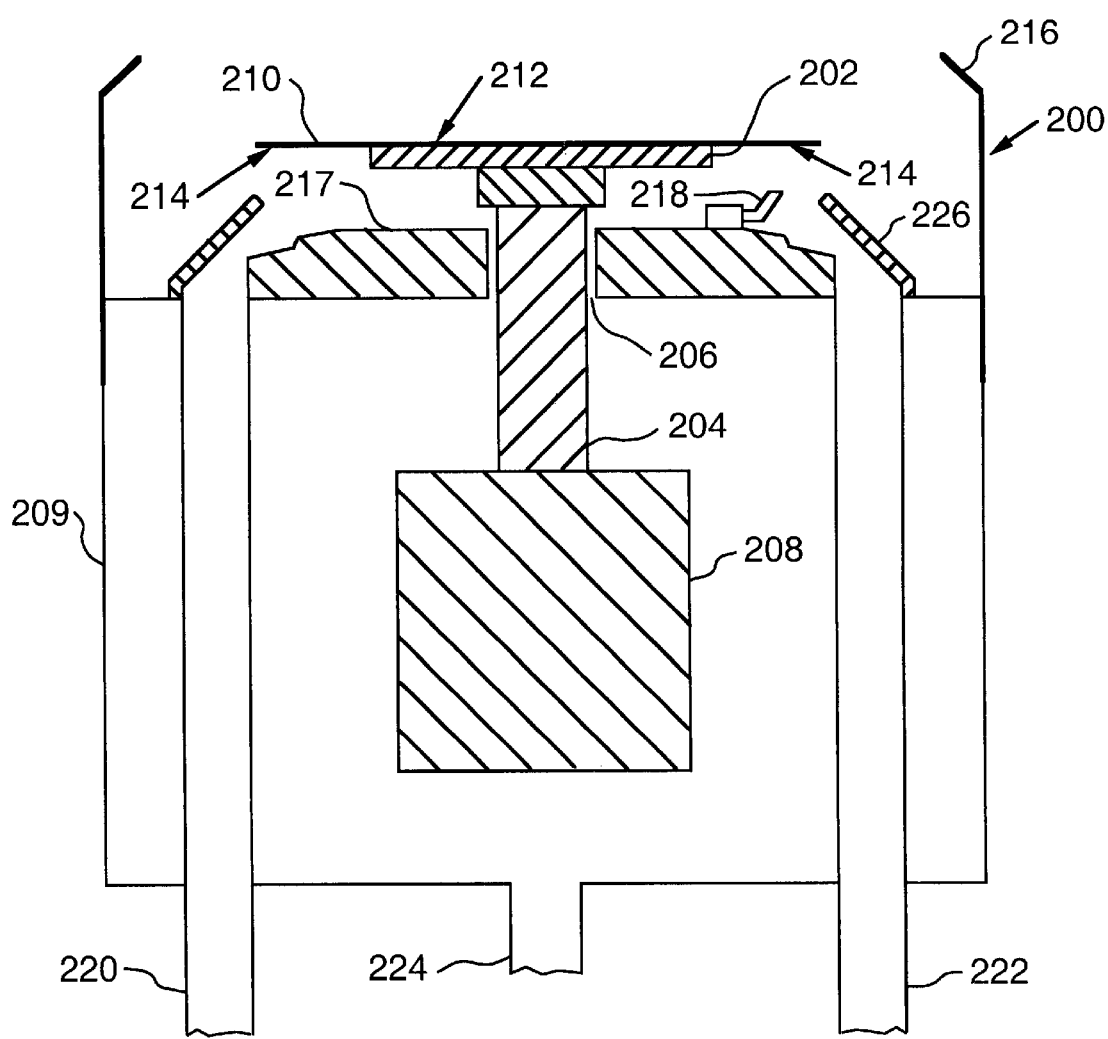
FIG. 1 is a side cross sectional view of a prior art spin coating apparatus.
Figure 2:
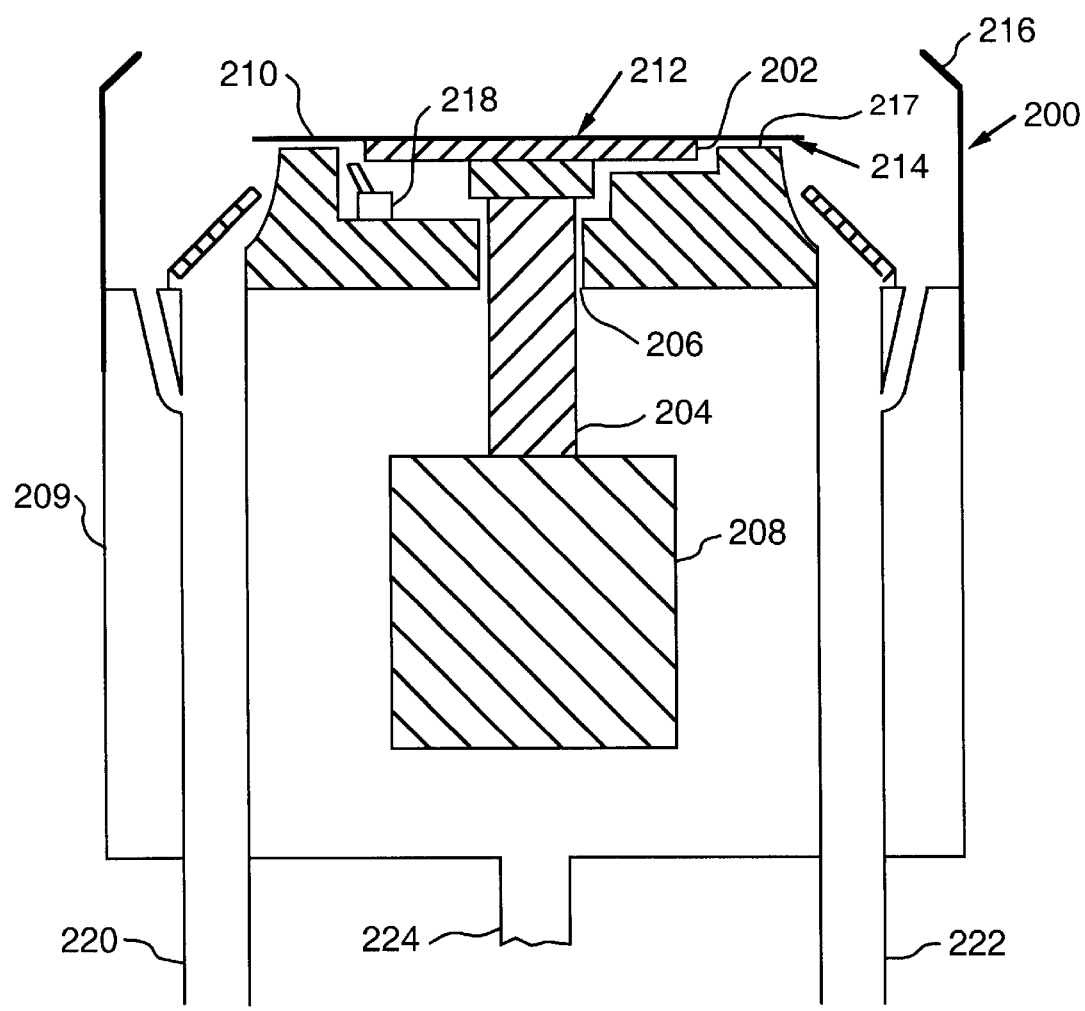
FIG. 2 is a side cross sectional view of another prior art spin coating apparatus.

The operation of the apparatus 10 will be described generally with reference to the drawings for the purpose of illustrating present preferred embodiments of the invention only and not for purposes of limiting the same. The apparatus 10 of the present invention includes a process bowl 12 through which a rotatable chuck 14 is disposed to support a wafer 16 having a diameter D, atop surface 13, a bottom sure 15 and an edge 17 during a spin coating of a coating material onto the wafer 16. The bowl 12 is attached to an exhausted drain system 18 to allow for the removal of excess liquid and vapor coating material spun off the wafer 16 during the spin coating operation, as well as solvent materials. While preferred embodiments of the invention will be discussed with respect to spin a coating material onto a circular surface of a wafer, one skilled in the art will appreciate that the invention can be suitably modified to dispense process liquids onto any number of surfaces.

In a preferred embodiment, the process bowl 12 is circularly shaped having a central axis A—A, and a bottom 20 and a side 22 defining an interior region 24. The side 22 has an upper edge 21 with a vertical lip 23 extending therefrom. The bottom 20 includes a generally cylindrically shaped raised portion 26 surrounding central axis A—A having an upper surface 25 containing a central opening 28 surrounded by an annular lower portion 27. The upper surface 25 of the raised portion 26 has a peripheral surface 32 that is sloped toward the lower portion 27 leading to a circumferential step 34. Solvent dispense nozzles 30 are internally formed in the raised portion 26 circumferentially around the central axis A—A and are attached to a solvet source (not shown) and directed at the bottom surface 15 of the wafer 16. The dispense nozzles 30 are distributed circumferentially and are directed radially away from the axis A—A through peripheral source 32. The circumferential step 34 contains notched leakage paths 36 corresponding to the location of the dispense nozzles 30 to allow solvent provided through the solvent dispense nozzles 30 to drain to the lower annular portion 27. The interior region 24 is unsegregated or unpartitioned to facilitate the flow of excess liquid and vapor to the drain system 18. Alternatively, the interior region 24 could be partitoned to form segregated plenum and mutual fluid communication between the partitioned plenum and the drain system 18 could be provided.

A circular air ring 40 is provided having an inner rim 42, an outer rim 44 and top and bottom surfaces, 46 and 48, respectively. The top and bottom surfaces, 46 and 48, respectively, are crowned wherein the crown forms a circle having a diameter less than that of the wafer 16 and defining an inner sloped surface 50 and an outer sloped surface 52. The inner rim 42 is seated on the circumferential step 34 and the inner sloped surface 50 and the sloped peripheral surface 32 define a first circumferential groove 54 having two edges, 55 and 56, respectively and a base 58. The solvent is dispensed using the dispense nozzle 30 and the solvent and the excess coating material are directed toward the bottom surface 15 of the wafer 16 above the groove 54 drained through the notched leakage paths 36. Preferably a second circumferential groove 60 is formed at the crown of the top surface 46 in close proximity to the edge 17 of the wafer 16, when the wafer 16 is supported by the chuck 14. The groove 60 is defined by edges, 56 and 62, respectively, and base 64 contains perforations 66 extending from the top surface 46 through the bottom surface 48. The bottom surface 48 and the bottom 20 of the bowl 12 define a lower plenum 70 that extends annularly around the raised portion 26. The top surface 46 and the side 22 of the bowl 12 define an upper plenum 72 that extends annularly between the outer rim 44 of the air ring 40 and the side 22. When the inner rim 42 is seated on the circumferential step 34, the outer rim 44 is preferably not in contact with the bowl 12, thereby providing fluid communication between the upper and lower plenums, 70 and 72, respectively.

Figure 3:
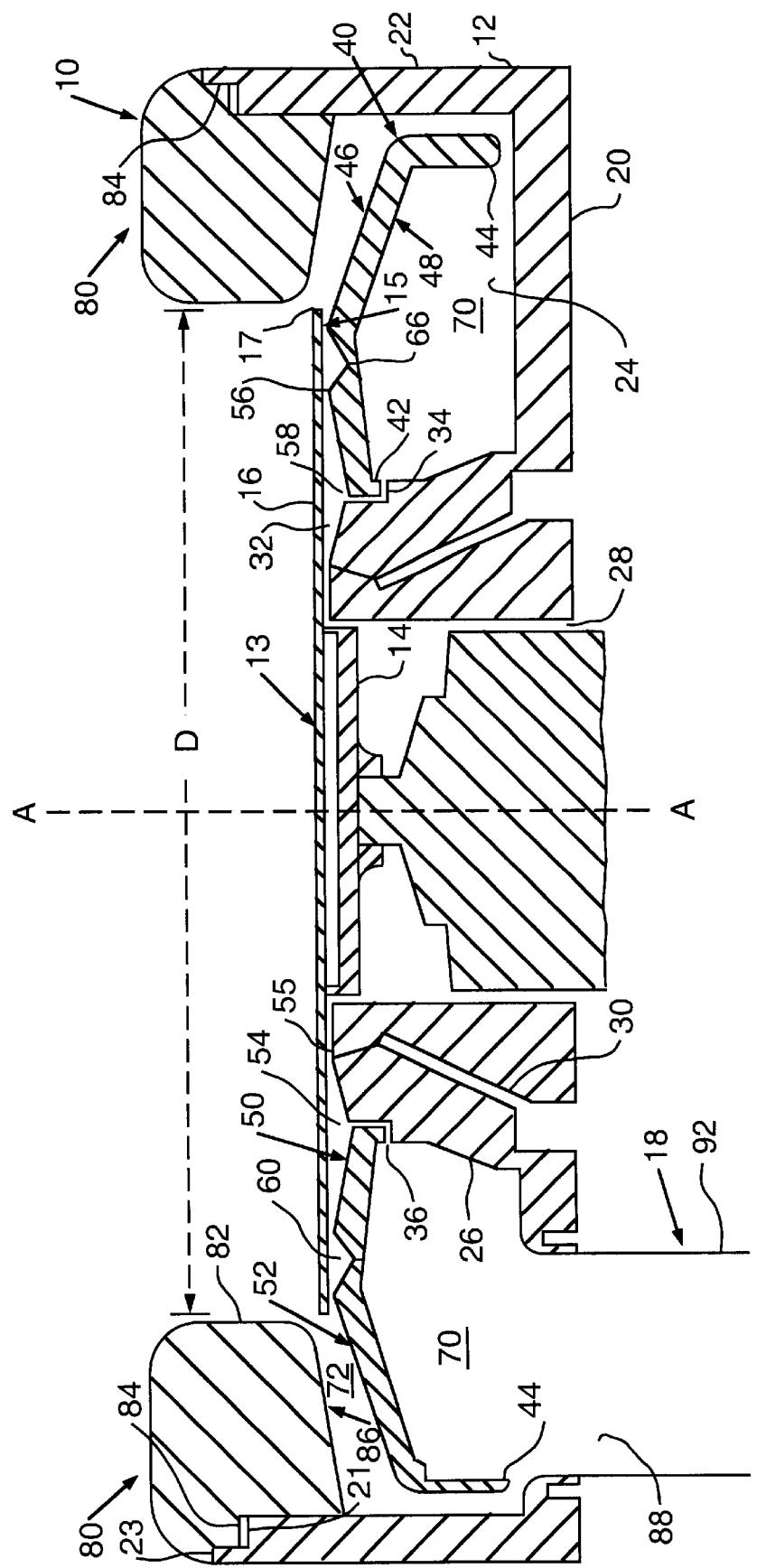
FIG. 3 is a side cross sectional view of a preferred embodiment of the present invention with a wafer supported by a chuck in a process position.

Preferably, a top ring 80 is provided having an inner lip 82 that extends into the interior region 24 having a diameter greater than the diameter of the wafer 16 and an outer diameter containing two circumferential steps 84 that mate with side edge 21 and lip 23. The top ring 80 has a bottom face 86 that extends toward the bottom 20 of the bowl 12 and opposes the top surface 46 and preferably slopes form the inner lip 82 to the outer diameter, such that bottom face 86 is above the wafer 16 near the inner lip 82 and below the wafer 16 near the side 22, when the wafer 16 is being supported in a process position, as shown in FIG. 3, and the bottom face 86 and the top surface 46 form a plenum region that is part of the upper plenum 72. The bowl 12, air ring 40 and top ring 80 are preferably constructed from a material that is resistant to, but wetted, by the spin coating chemicals and can be easily cleaned, such as Teflon, although other material can be incorporated to suit the particular needs of the practitioner.

In a preferred embodiment the exhausted drain system 18 includes a single drain 88 in the bottom 20 of the bowl 12, which is in close proximity to the outer rim 42 and in fluid communication with the lower and upper plenums 70 and 72, respectively, thereby providing unsegregated or unpartitioned access to the drain system 18. The unsegregated access to the drain 88 reduces the amount of material that precipitates or dries in the bowl 12 resulting in fewer maintenance shutdowns to clean the bowl. The use of a single drain provides for higher flow rates near the drain which maintain particles in suspension and leads to increased mix of the solvent and the excess coating material allowing the coating material to be carried out of the system. Also, the use of a single drain and an unsegregated bowl maintains the solvent vapors in contact with coating material preventing additional evaporation of the solvent and drying of the coating material in the bowl 12 and in the drain lines, The exhausted drain 88 is connected to an exhaust manifold 90 through piping 92. The liquid and the vapor are gravitationally separated in the exhaust manifold 90 with the vapor exiting through exhaust pipe 96 and the liquid exiting rough drain 98. A negative pressure is applied to the exhausted drain system 18 through exhaust pipe 96, which draws vapor and liquid from the interior region 24 of the bowl 12. A semicircular cylindrical baffle 100 is attached to the bottom 20 around the drain 88 to more uniformly distribute the flow in the interior region 24. The presence of the exhausted drain 88 on one side of the bowl 12 would tend to preferentially exhaust vapor from the portion of the bowl 12 nearest to the drain 88. The baffle 100 forces the vapor and liquid to flow into the drain 88 in a predetermined direction resulting in a more uniform flow field in the interior region 14 that further enhances the mixing of the solvent and the coating material providing for a cleaner bowl 12. In an alternative embodiment, the bottom 20 can be sloped to further aid the flow of the solvent and coating material to the drain 88.

Figure 4:
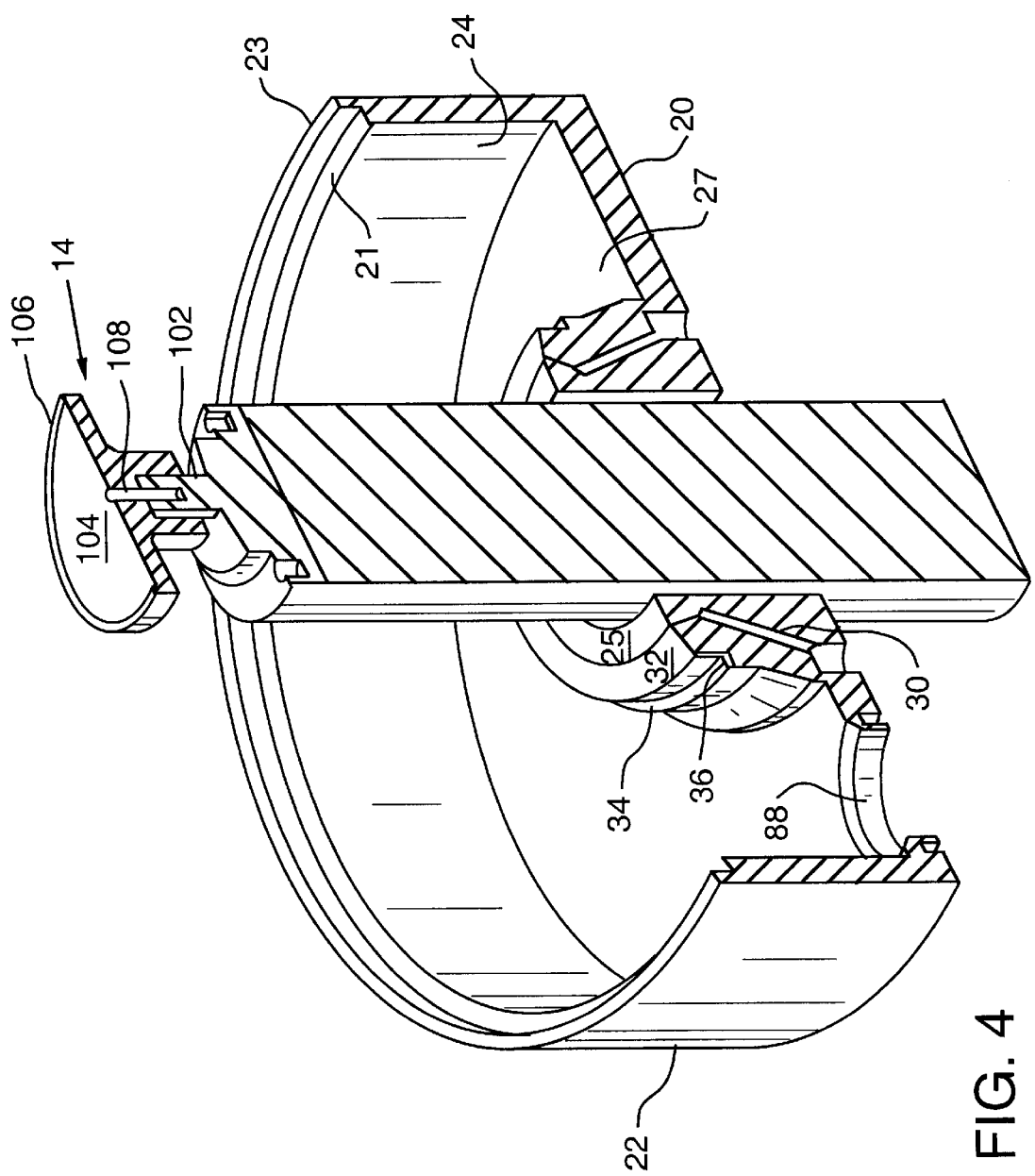
FIG. 4 is a perspective cross sectional view of the bowl with the wafer chuck disposed in the wafer loading position.
Figure 5:
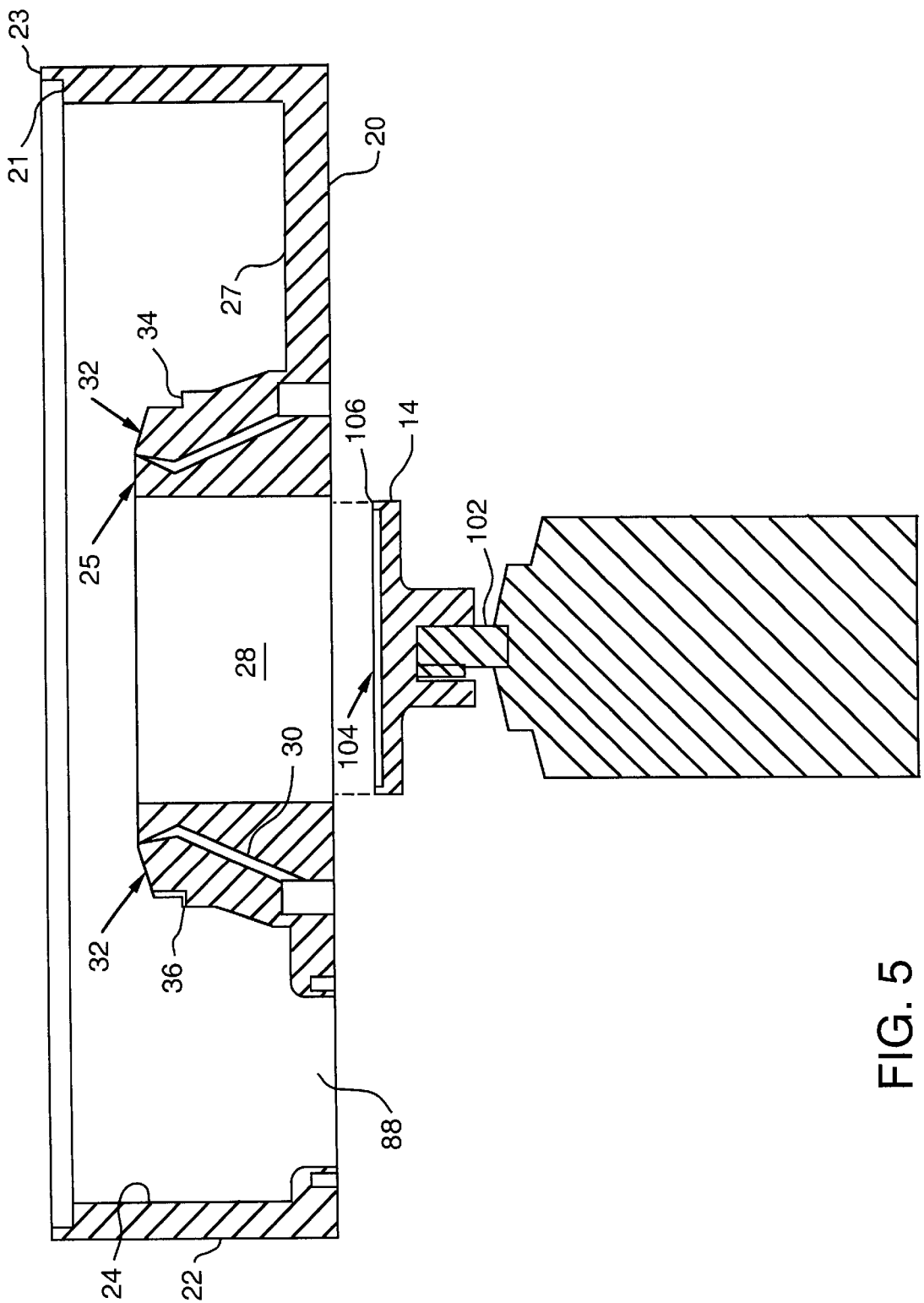
FIG. 5 is a side cross sectional view of the bowl with the wafer chuck disposed in the maintenance position.
Figure 6:
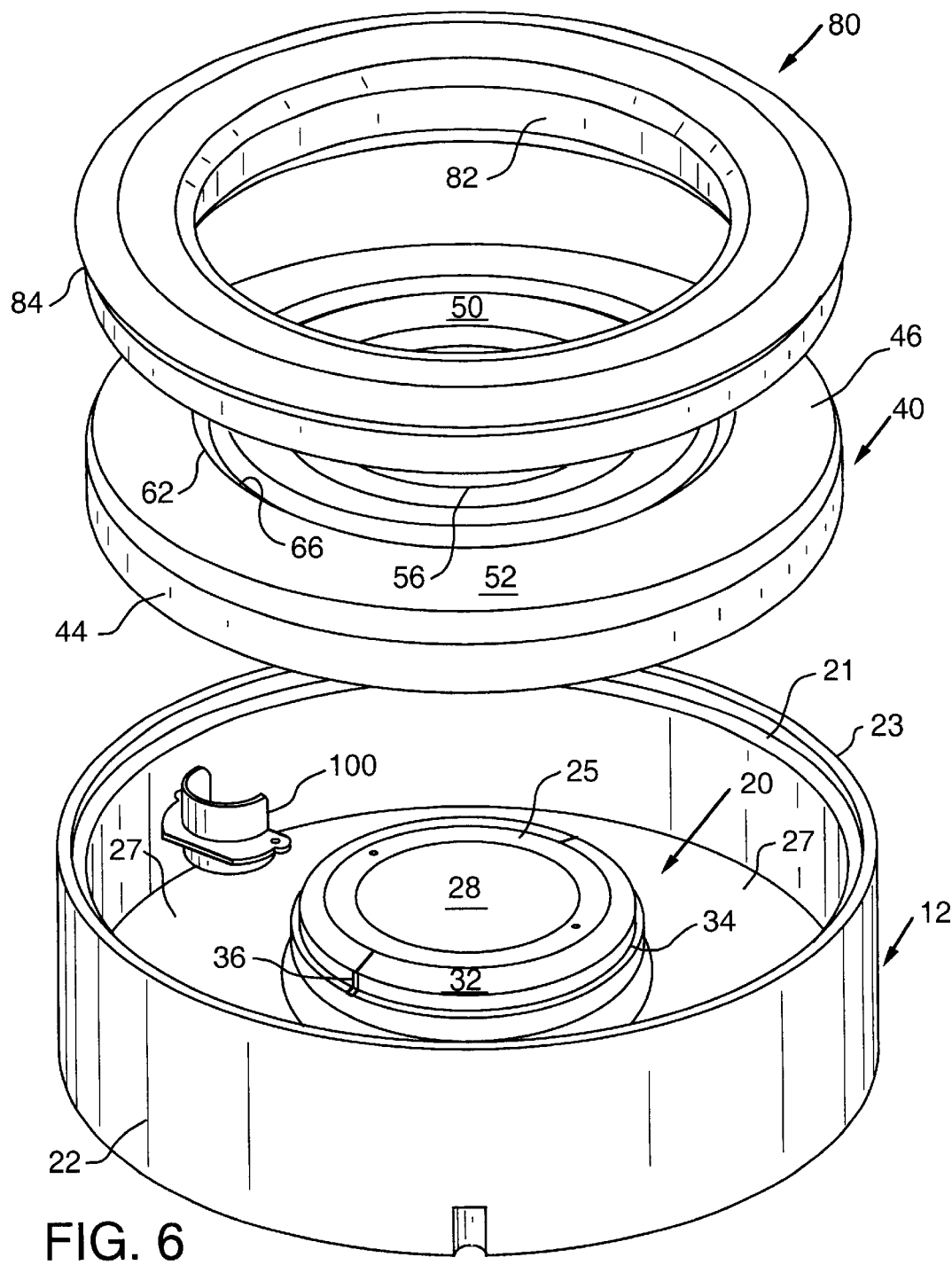
FIG. 6 is an exploded perspective view of the bowl with the air ring, top ring and baffle.
Figure 7:
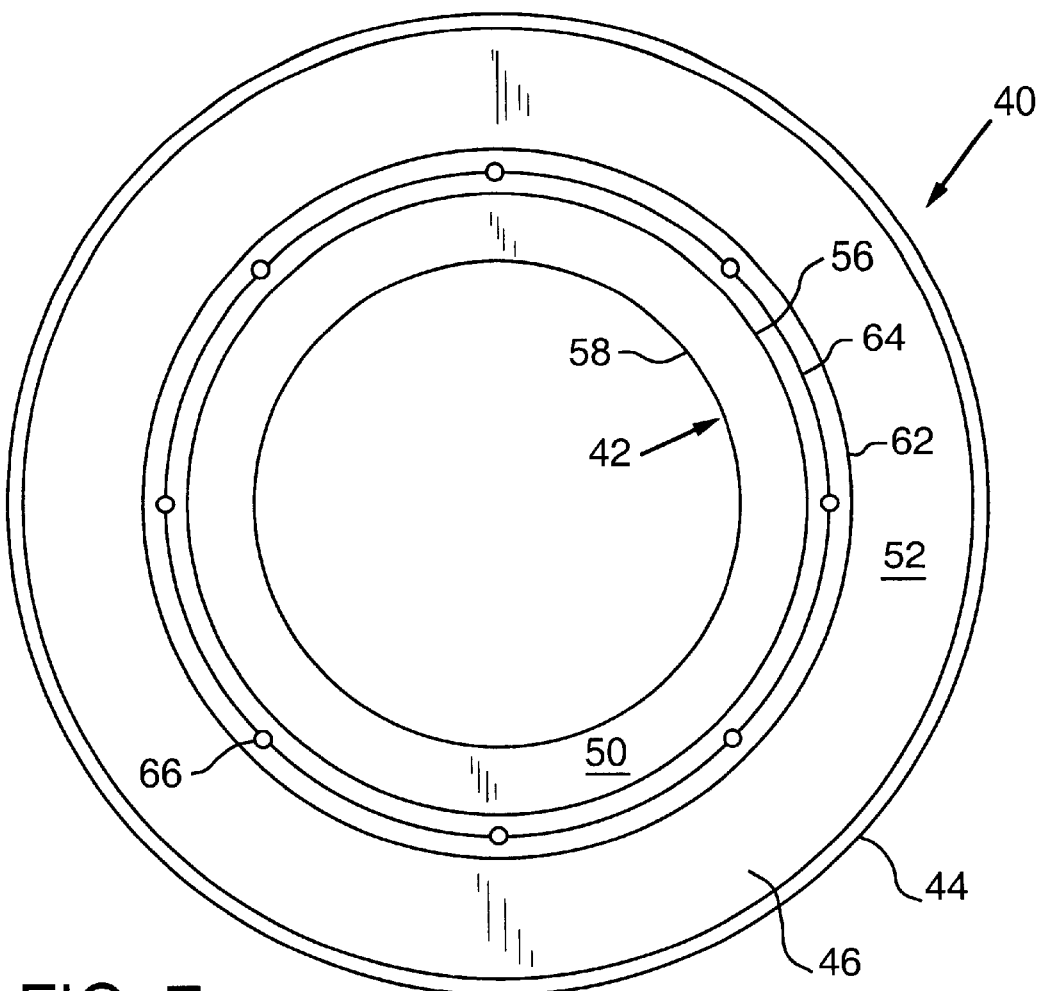
FIG. 7 is a top plan view of the air ring.
Figure 8:
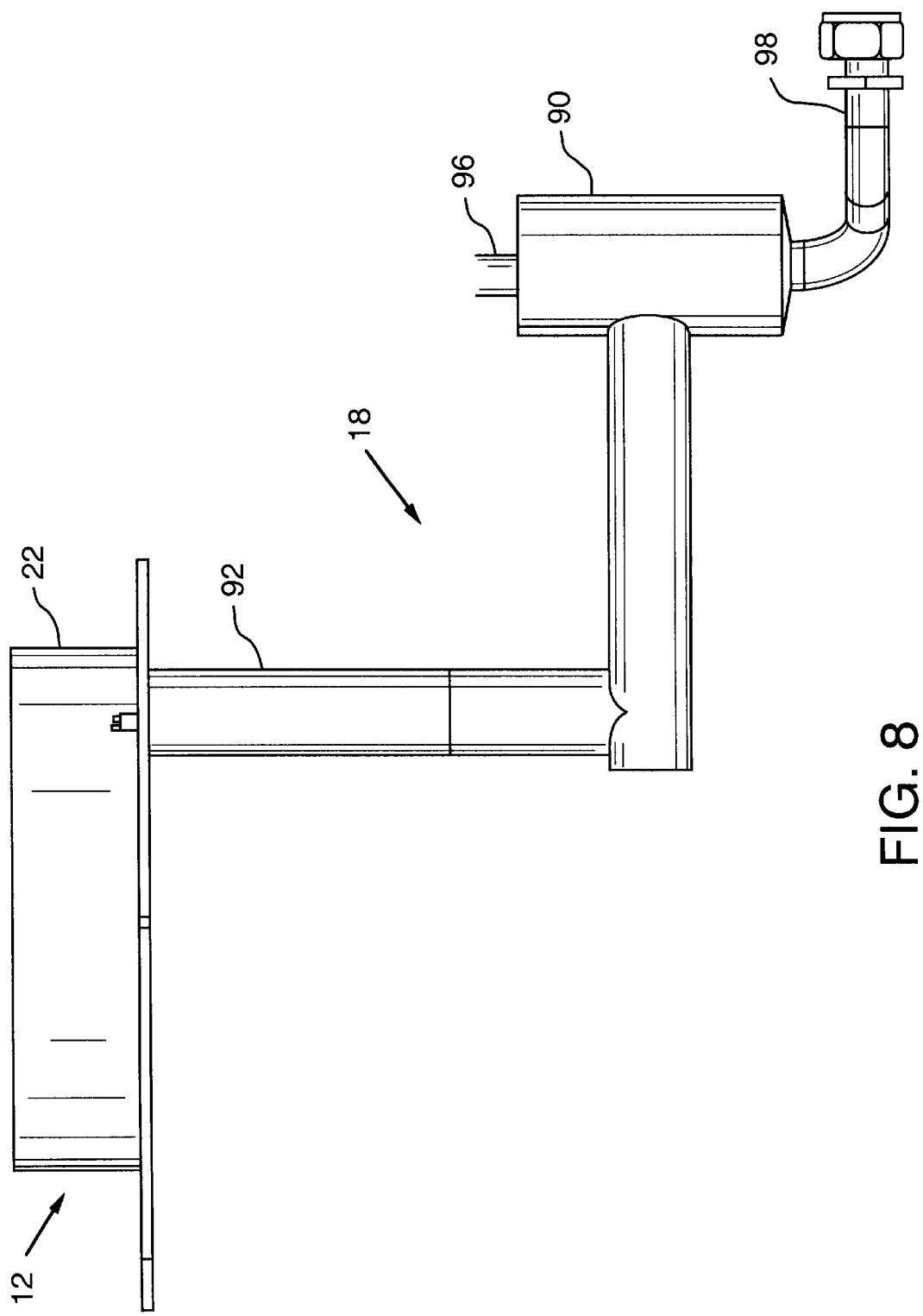
FIG. 8 is a side view of the exhausted drain attached to the bowl.

The drainage performance of the single drain 88 is enhanced through the use of the chuck 14 that is dimensionally smaller than the opening 28 in the bowl 12. The chuck 14 is disk shaped and attached by a shaft 102 to a spin motor (not shown) for rotation of the shaft 102 and the chuck 14 and to servomotor (not shown), or other lift means, which is used to reciprocate the chuck 14 through the opening 28 between a maintenance position (FIG. 5), a process position (FIG. 3) and a wafer receiving position (FIG. 4). Because the chuck 14 is dimensionally smaller tan the opening 28, the processing position can be lowered with respect to the raised portion 26 and the air ring 40, which allows the practitioner of the present invention to control the resistance of the flow path from between the wafer 16 and the raised portion 26 and the chuck 14 and the opening 28. A important aspect of controlling the resistance is that the flow of solvent vapors through the opening 28 can be minimized because the path of least resistance will be through or around the air ring 40 to the exhausted drain 88. Also, because the chuck 14 can be reciprocated through the opening 28, the spin motor and the servomotor can be separated from the bowl 12, so that the small amounts of solvent vapor that may travel through the opening 29 can be processed with the system air all of which combine to eliminate the need to have a dedicated vapor exhaust. In addition, the chuck 14 can be reciprocated to its maintenance position and the bowl 12 or the chuck 14 and lift means can be maintained separately without the need to disassemble either component, which greatly reduce maintenance time. For example, if a process bowl 12 is to be cleaned, the chuck 14 can be lowered to the maintenance position and the process bowl 12 can be switched out and replaced with another bowl so that the spin coating apparatus can be operating while the cleaning is being performed which significantly reduces the downtime of the processor. The chuck 14 is preferably a hard plastic, such as Teflon or polyphenylene sulfide CPPS), or a metal oxide through which a vacuum can be drawn using port 108 to secure the wafer 16 on the chuck 14 and which also has a low thermal conductivity to minimize the amount of heat generated by the spin motor that is transferred to the wafer 16. In a preferred embodiment, the top surface 104 has a circumferential raised rim 106 that allows the wafer 16 to be supported in sufficiently close proximity to the top surface 104 to allow the vacuum to hold the wafer 16, but the gap between the wafer 16 and the top surface 104 further reduces the heat transfer to the wafer 16.

In the operation and method of the present invention, the air ring 40 is inserted into the bowl 12 with the inner rim 42 seated on the circumferential steps 84 and the top ring 80 is positioned so that the circumferential steps 84 mates with side edge 21 and lip 23 on the side 22 of the bowl 12. The chuck 14 is initially in the maintenance position and then is moved tough the process position to the wafer receiving, or loading, position using the servomotor. As a wafer 16 has been placed on the chuck 14, a vacuum is drawn on the chuck 14 to secure the wafer 16 and the chuck 14 is lowered to the process position. The spin motor is activated to rotate the chuck 14 and wafer 16 and a negative pressure is applied through the exhaust 96 as the coating material is then dispensed onto the wafer 16 using a dispense assembly connected to a coating source. The rotation of the wafer 16 causes the coating material to distribute over the top surface 13 of the wafer 16 and the majority of the excess coating material will be spun off the wafer 16 into the upper plenum 72 and will contact the downwardly sloping surfaces of either the top surface 48 of the air ring 40, the side 22, or the bottom face 86, which serve to direct the flow of material toward the lower plenum 70 and drain 88. Some of the excess coating material will creep around the edge 17 of the wafer 16 onto the bottom surface 15. The excess coating material will travel along the bottom surface 15 until it encounters circumferential edge 62 which allows coating material to move downwardly along the surface 52 or toward base 64. If the material is not removed by edge 62, the excess coating material traveling toward axis A—A will next encounter edge 56 which also allows the excess coating material to flow downwardly to base 64 or on she 50, both of which are in fluid communication with the lower plenum 70. Excess coating material that passes edge 56 is sprayed by solvent nozzles 30, which are directed away from axis A—A toward the bottom surface 15. The solvent and excess coating material run down the downwardly sloping surfaces 50 and 32 and are drained through notched leakage paths 36 into the lower plenum 70. The proximity of the bottom surface 13 of the wafer 16 to the raised portion 26 of the bowl 12 as a result of the chuck 14 having smaller dimension than the opening 28 serves to minimize the flow of solvent back through the opening 28. The use of a single drain provides for an unsegregated exhaust system that allows the solvent to mix freely with the excess coating material, thereby minimizing the amount of dry coat material that remains in the bowl 12 and the drain lines when the solvent evaporates. After the coating operation is complete, the rotation of the wafer 16 and chuck 14 is stopped and the chuck is raised using the servomotor to the wafer receiving position and the wafer is removed and another wafer is placed onto the chuck 14 or the chuck 14 is lowered to the maintenance position, at which time the bowl 12 can be removed for cleaning or maintenance can be performed on the chuck 14, spin motor and/or servomotor.

Those or ordinary skill in the art will appreciate that the present invention provides significant advantages over the prior art. In particular, the subject invention eliminates the recirculation zone beneath the, wafer and prevents capillary forces from being produced between surface air ring that can result in damage to the wafer by the inclusion of vented depressions in the surface of the air ring. The subject invention also improves the drainage of the process bowl so as to provide a cleaner process bowl, thereby reducing the extent of downtime required to clean the bowl. Also, the subject invention has the advantage of allowing the wafer chuck and motor assembly to be separated from the process bowl without disassembly of either component and provides added versatility in the positioning of the wafer within the process bowl, which was not present in the prior art. While the subject invention provides these and other advantages over the prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. A method of restricting a flow of solvent vapor through an opening in a bowl having a cross-sectional area and through which a shaft is movably disposed and wherein the shaft is attached to a rotatable chuck supporting a wafer in the bowl, comprising;

providing the chuck with a cross-sectional area perpendicular to a direction of shaft movement that is less than the cross-sectional area of the opening; and lowering the chuck until the wafer is in close proximity to the bowl.

2. The method of claim 1, further comprising:

providing the bowl with a raised portion containing the opening; and wherein said lowering comprises lowering the chuck until the wafer is in close proximity to the raised portion of the bowl.

3. The method of claim 2, further comprising exhausting solvent vapor from the bowl.

4. The method of claim 3, wherein exhausting solvent vapor includes:

providing a drain on the bottom of the bowl;

connecting an exhaust drain system to the bottom of the bowl around the drain; and drawing the flow of solvent vapor from the bowl through the exhaust drain system.

5. The method of claim 3, further comprising uniformly distributing the flow of solvent vapor in an interior region of the bowl.

6. The method of claim 5, wherein uniformly distributing the flow of solvent vapor includes connecting a baffle in an interior region of the bowl around the drain.

7. The method of claim 6, wherein connecting a baffle includes connecting a semicircular cylindrical baffle.

8. A method of restricting a flow of solvent vapor through an opening in a bowl through which a shaft is movably disposed and wherein the shaft is attached to a rotatable chuck supporting the wafer in the bowl, comprising:

providing the chuck with a cross-sectional area perpendicular to a direction of shaft movement that is less that the cross-sectional area of the opening;

providing the bowl with a raised portion containing the opening; and lowering the chuck until the wafer is in close proximity to the raised portion of the bowl.

* * * * *

UNITED STATES PATENT AND TRADEMARK OFFICE
CERTIFICATE OF CORRECTION

PATENT NO. : 6,417,117 B1
DATED : July 9, 2002
INVENTOR(S) : Davis, Shawn D.

It is certified that error appears in the above-identified patent and that said Letters Patent is hereby corrected as shown below:

Column 1,
Line 11, delete "related" and insert -- relates -- therefor.
Line 22, delete "tun" and insert -- turn -- therefor.
Line 26, delete "piously" and insert -- previously -- therefor.
Line 28, delete "is the" and insert -- is then -- therefor.
Line 55, delete "attach" and insert -- attack -- therefor.

Column 2,
Line 34, delete "he" and insert -- the -- therefor.
Line 55, delete "hat" and insert -- that -- therefor.
Line 59, after "formed that" insert -- increases --.

Column 5,
Line 59, delete "," and insert -- . -- therefor.
Line 64, delete "rough" and insert -- through -- therefor.

Column 6,
Line 22, delete "tan" and insert -- than -- therefor.
Line 27, delete "A" and insert -- An -- therefor.
Line 48, delete "CPPS" and insert -- PPS -- therefor.
Line 65, delete "tough" and insert -- through -- therefor.

Column 7,
Line 22, delete "she" and insert -- surface -- therefor.
Line 49, delete "the," and insert -- the -- therefor.

Signed and Sealed this

Twenty-ninth Day of October, 2002

*Attest:*

*Attesting Officer*

JAMES E. ROGAN
*Director of the United States Patent and Trademark Office*